United States Patent [19]

Imanishi

[11] Patent Number: 5,682,040
[45] Date of Patent: Oct. 28, 1997

[54] COMPOUND SEMICONDUCTOR DEVICE HAVING A REDUCED RESISTANCE

[75] Inventor: Kenji Imanishi, Kawasaki, Japan

[73] Assignee: Fujitsu Limited, Kanagawa, Japan

[21] Appl. No.: 611,008

[22] Filed: Mar. 5, 1996

[30] Foreign Application Priority Data

Apr. 25, 1995 [JP] Japan ................... 7-099189

[51] Int. Cl.$^6$ ............... H01L 31/0328; H01L 31/0336; H01L 31/072; H01L 31/109
[52] U.S. Cl. ................... 257/12; 257/192; 257/194
[58] Field of Search ................... 257/12, 192, 194, 257/745

[56] References Cited

U.S. PATENT DOCUMENTS

| | | | |
|---|---|---|---|
| 5,332,451 | 7/1994 | Hata et al. | 148/33.2 |
| 5,373,186 | 12/1994 | Schubert et al. | 257/592 |
| 5,393,990 | 2/1995 | Kohn | 257/12 |

OTHER PUBLICATIONS

Shirakashi, J. et al., "Characterization of Heavily Carbon-doped GaAs With a Hole ...", *Journal of Crystal Growth*, vol. 150, 1995, pp. 585-590.

Dubon-Chevallier, C. et al., "GaAs/GaInP HBT Structures Grown By CBE With a Highly ...", *Inst. Phys. Conf.*, Ser. No. 129, 1993, pp. 705-710.

Fujita, S. et al., "Novel Hemt Structures Using ...", Fifth International Conf. on Indium Phosphide and Related Material, 1993, pp. 498-500.

Sueiro, H. et al., "Highly Doped InGaP/InGaAs/GaAs ..." *IEEE Transactions on Electrons Devices*, vol. 41, No. 10, 1994, pp. 1743-1746.

Primary Examiner—Sara W. Crane
Assistant Examiner—Douglas Wille
Attorney, Agent, or Firm—Armstrong, Westerman, Hattori, McLeland & Naughton

[57] ABSTRACT

A method for fabricating a semiconductor device includes a step of depositing a first compound semiconductor layer by a MOVPE process to have a first conductivity type, doping a surface of the first compound semiconductor layer to the same, first conductivity type, by implementing a planar doping process as a result of decomposition of a gaseous dopant, such that no substantial growth of the first compound semiconductor layer occurs during the planar doping process, and depositing a second compound semiconductor layer of the first conductivity type on the doped surface of the first compound semiconductor layer by a MOVPE process.

10 Claims, 4 Drawing Sheets

COMPOUND SEMICONDUCTOR DEVICE HAVING A REDUCED RESISTANCE

BACKGROUND OF THE INVENTION

The present invention generally relates to semiconductor devices and more particularly to a compound semiconductor device having a reduced resistance at a cap layer interface.

Compound semiconductor devices such as HEMTs and HBTs are used extensively in high frequency applications where high speed device operation is essential. In compound semiconductor devices, large electron mobility, which is pertinent to compound semiconductor materials, facilitates the high speed operation of the device substantially.

Generally, a compound semiconductor device includes a heterojunction interface of AlGaAs and GaAs in the essential part of the device. For example a HEMT uses such a heterojunction interface between the channel layer formed of an undoped GaAs and an electron supplying layer of an n-type AlGaAs for creating a layer of two-dimensional electron gas in the channel layer along the foregoing heterojunction interface. On the other hand, a typical HBT uses an emitter layer of n-type AlGaAs formed on a base layer of p-type GaAs. By using a widegap material such as AlGaAs for the emitter layer, one can increase the current gain of the device. Further, by using GaAs that exhibits a very large electron mobility, it is possible to maximize the operational speed of the device.

In order to avoid the formation of various non-radiative recombination centers associated with the deep impurity levels existing in the AlGaAs layer, recent compound semiconductor devices are increasingly using InGaP in place of the AlGaAs layer. It should be noted that such non-radiative recombination centers facilitates degradation of the device.

In conventional compound semiconductor devices including a GaAs/AlGaAs heterojunction interface, it has been practiced to provide a cap layer of GaAs doped to the n⁺-type on the AlGaAs layer for protecting the same from oxidation and for providing an ohmic contact thereto.

Figure 1:
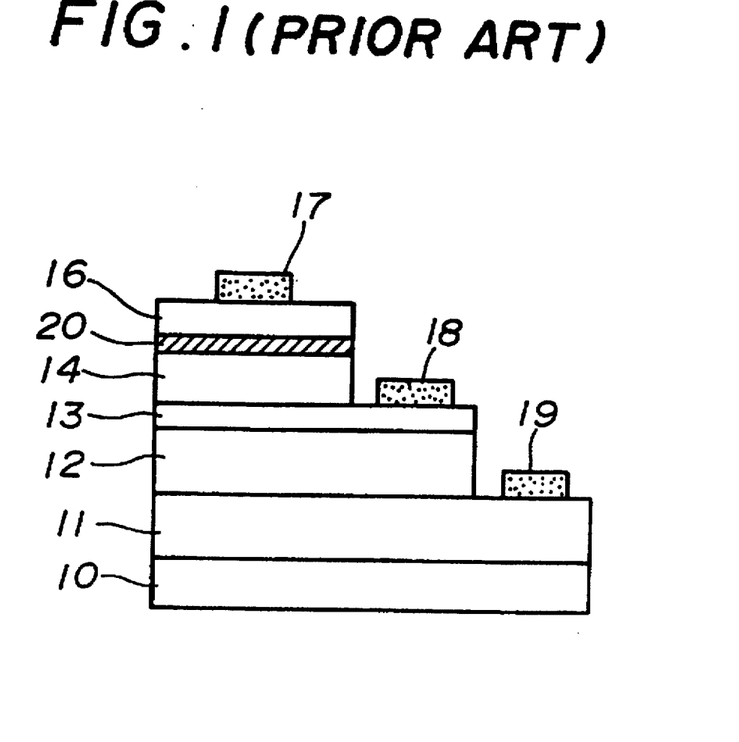
FIG. 1 is a diagram showing the structure of a conventional HBT.

FIG. 1 shows an example of an HBT that uses InGaP for the emitter layer.

Referring to FIG. 1, a sub-collector layer 11 of n-type GaAs is provided on a semi-insulating GaAs substrate 10, followed by a deposition of a collector layer 12 of GaAs on the sub-collector layer 11. Further, a base layer 13 of p-type GaAs is grown on the collector layer 12, and an emitter layer 14 of InGaP doped to the n-type by Si is deposited further thereon. The emitter layer 14 thus formed, in turn, is covered by a cap layer 16 of GaAs doped to the n-type by Si. Thereby, a layered semiconductor body including the semiconductor layers 11–16 on the substrate 10 is obtained. It should be noted that the deposition of the layers 11–16 is achieved consecutively one after another by employing a vapor phase deposition process such as MOVPE process.

After the formation of the cap layer 16, the layered semiconductor body formed as such is subjected to an etching process for partially removing the cap layer 16, the emitter layer 14 and the base layer 13, such that a part of the sub-collector layer 11 and a part of the base layer 13 are exposed. By providing ohmic electrodes 17, 18 and 19 respectively on the cap layer 16, the exposed surface of the base layer 18 and the exposed surface of the sub-collector layer 11, the fabrication of the HBT is completed.

The HBT having such a construction achieves injection of electrons into the base layer 13 from the emitter layer 14 and further into the collector layer 12 from the base layer 13, similarly to ordinary bipolar transistors, wherein the operational speed of the device is improved significantly as a result of use of GaAs for the base layer 13. Further, a large gain is achieved as a result of use of InGaP, which is a wide gap material, for the emitter layer 14. As noted before, such an HBT that uses InGaP for the emitter layer in place of conventional AlGaAs minimizes the problem of degradation of the device caused by non-radiative recombination centers.

Figure 2:
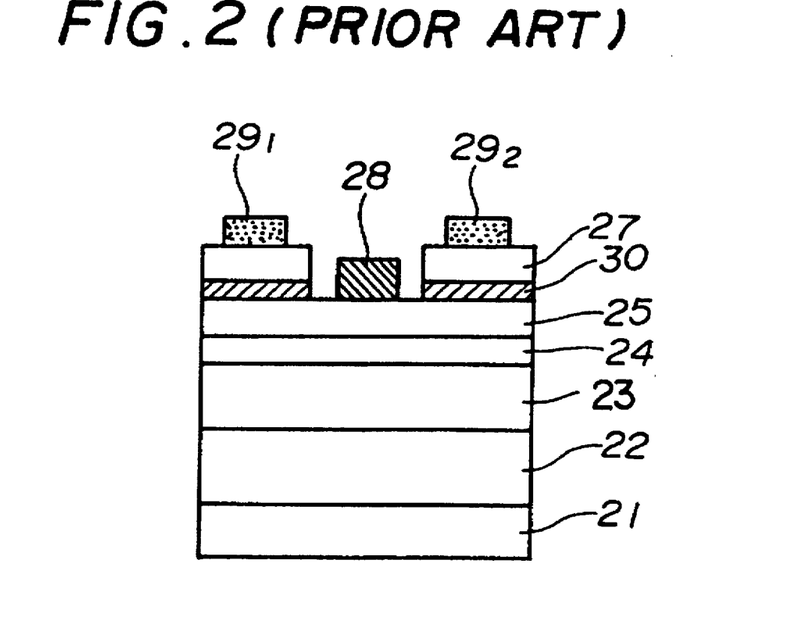
FIG. 2 is a diagram showing the structure of a conventional HEMT.

FIG. 2 shows an example of a conventional HEMT that uses InGaP for the electron supplying layer.

Referring to FIG. 2, a buffer layer 22 of undoped GaAs is deposited on a semi-insulating GaAs substrate 21, followed by a deposition of a channel layer 23 of undoped GaAs on the buffer layer 22. Further, a spacer layer 24 of undoped InGaP is deposited on the channel layer 23, followed by a deposition of an electron supplying layer 25 of n-type InGaP on the spacer layer 24. Finally, a cap layer 27 of n-type GaAs is deposited on the electron supplying layer 25. Thereby, a layered semiconductor body including the layers 22–27 on the substrate 21 is obtained similarly to the HBT of FIG. 1, wherein the deposition of the layers 22–27 is achieved consecutively one after another by a MOVPE process.

After the layered semiconductor body is formed as such, a part of the cap layer 27 is removed by an etching process in correspondence to the channel region of the device, and a Schottky electrode 28 is provided on the exposed part of the electron supplying layer 25 as a gate electrode. Further, a pair of ohmic electrodes $29_1$ and $2_{92}$ are provided on the cap layer 27 at both sides of the Schottky electrode 28 respectively as a source electrode and a drain electrode.

In such a construction, a two-dimensional electron gas is formed in the channel layer 23 along the heterojunction interface between the channel layer 23 and the spacer layer 24 thereon as is well known in the art. By applying a control voltage to the gate electrode 28, one can control the source-drain current flowing between the source electrode $29_1$ and the drain electrode $29_2$ through the two-dimensional electron gas.

In the HEMT of such a construction, the problem of degradation of the device due to donor-related deep level (DX-center) is successfully avoided, by using InGaP for the spacer layer 24 and further for the electron supplying layer 25, in place of conventional AlGaAs.

In any of the HBT and HEMT of FIGS. 1 and 2, however, there appears a problem of increased resistance at the heterojunction interface where a layer of GaAs is grown on a layer of InGaP to form a GaAs/InGaP structure. For example, a high resistance layer 20 appears in the structure of FIG. 1 at the interface where the cap layer 16 of GaAs is grown on the emitter layer 14. Similarly, a high resistance layer 30 appears in the structure of FIG. 2 at the interface where the cap layer 27 of GaAs is grown on the electron supplying layer 25 of InGaP. When such a high resistance layer such as the layer 20 or layer 30 is formed, the operational speed of the device is seriously deteriorated. For example, it was discovered that an HBT having an electrode of 2×5 μm² shows an emitter resistance of 35–40Ω in the open-collector state. In such a case, it was found that the characteristic frequencies $f_T$ and $f_{max}$ of the bipolar transistor becomes 20 GHz and 50 GHz respectively, which are insufficient for the desired high frequency operation of the device.

The reason of formation of such an undesirable high resistance layer is attributed to the mutual diffusion of the group V elements at the heterojunction interface. More specifically, the semiconductor material of InGaP shows a relatively high partial pressure of P, and thus, P atoms readily escape from a layer of InGaP, leaving a vacant site in the crystal structure of InGaP. When a MOVPE deposition of GaAs is made in such a state, the As atoms easily penetrate into the crystal structure of InGaP and occupy the vacant site of P, resulting in a mixing of P and As atoms in the InGaP layer at the interface to the GaAs layer. When such a mutual diffusion of P and As occurs at the heterojunction interface, there occurs a distortion in the crystal lattice due to the large difference in the atomic radius of the P and As atoms. It should be noted that such a distortion of the crystal lattice disturbs the periodic arrangement of atoms in the crystal lattice and induces a formation of deep impurity levels or carrier traps, which in turn leads to a depletion of carriers at the heterojunction interface. It is believed that the increase of resistance at the layer 20 or 30 is attributed to such a depletion of the carriers.

SUMMARY OF THE INVENTION

Accordingly, it is a general object of the present invention to provide a novel and useful compound semiconductor device and a fabrication process thereof wherein the foregoing problems are eliminated.

Another and more specific object of the present invention is to provide a compound semiconductor device and a fabrication process thereof wherein the depletion of carriers at a heterojunction interface in the device is successfully compensated for.

Another object of the present invention is to provide a semiconductor device, comprising:

a first compound semiconductor layer containing a first group V element;

a second compound semiconductor layer containing a second, different group V element;

a heterojunction interface formed at an interface between said first and second compound semiconductor layers;

said heterojunction interface containing a dopant with a sheet density such that a depletion of carriers at said heterojunction interface is substantially compensated.

Another object of the present invention is to provide a high electron mobility transistor, comprising:

a substrate;

a channel layer provided on said substrate;

a carrier supplying layer doped to a first conductivity type and provided on said channel layer, said carrier supplying layer comprising a first compound semiconductor material containing a first group V element;

a cap layer provided on said carrier supplying layer in an intimate contact with an upper major surface of said carrier supplying layer, said cap layer comprising a second compound semiconductor material doped to said first conductivity type and containing a second, different group V element;

a heterojunction interface formed between said carrier supplying layer and said cap layer, said heterojunction interface containing a dopant of said first conductivity type with a sheet density such that a depletion of carriers at said heterojunction interface is substantially compensated;

a gate electrode provided on said electron supplying layer for establishing a Schottky contact therewith;

a first ohmic electrode provided on said cap layer at a first side of said gate electrode for establishing an ohmic contact therewith; and a second ohmic electrode provided on said cap layer at a second, opposite side of said gate electrode for establishing an ohmic contact therewith.

Another object of the present invention is to provide a heterobipolar transistor, comprising:

a substrate;

a collector layer of a first compound semiconductor material provided on said substrate;

a base layer of a second compound semiconductor material provided on said collector layer, said base layer being doped to a first conductivity type;

an emitter layer of a third compound semiconductor material provided on said base layer, said emitter layer being doped to a second, opposite conductivity type, said third compound semiconductor material containing a first group V element;

a cap layer of a fourth compound semiconductor material provided on an upper major surface of said emitter layer in an intimate contact therewith, said cap layer being doped to said second conductivity type, said fourth compound semiconductor material containing a second, different group V element;

a heterojunction interface formed between said emitter layer and said cap layer, said heterojunction interface containing a dopant of said second conductivity type with a sheet density such that a depletion of carriers at said heterojunction interface is substantially compensated;

a collector electrode connected electrically to said collector layer;

a base electrode provided on said base layer in electrical connection therewith; and an emitter electrode provided on said cap layer in electrical connection to said emitter layer.

Another object of the present invention is to provide a method for fabricating a semiconductor device, comprising the steps of:

(a) forming a first compound semiconductor layer of a first conductivity type and containing a first group V element, said step (a) including a decomposition of a metal organic source of said first group V element;

(b) doping, after said step (a), a surface of said first compound semiconductor layer by a dopant to said first conductivity type while suppressing a growth of said first compound semiconductor layer substantially; and (c) forming, after said step (b), a second compound semiconductor layer of said first conductivity type and containing a second, different group V element, on said surface of said first compound semiconductor layer, said step (c) including a decomposition of a metal organic source of said second group V element.

According to the present invention, the problem of depletion of carriers at the heterojunction interface is successfully eliminated, and the resistance of the device such as the source-drain resistance or the emitter resistance of the semiconductor device is reduced substantially. As a result of the reduced resistance, the semiconductor device of the present invention provides an excellent high frequency performance.

Other objects and further features of the present invention will become apparent from the following detailed description when read in conjunction with the attached drawings.

DETAILED DESCRIPTION OF THE PREFERRED EMBODIMENTS

Figure 3:
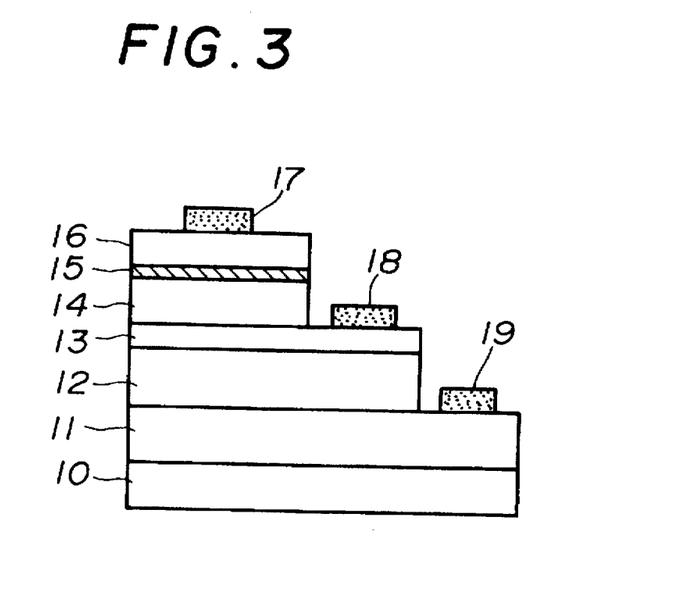
FIG. 3 is a diagram showing the construction of an HBT according to a first embodiment of the present invention.

FIG. 3 shows the construction of an HBT according to a first embodiment of the present invention. As the HBT of FIG. 3 has a construction similar to the one described with reference to FIG. 1, those parts corresponding to the parts described heretofore are designated by the same reference numerals and the description thereof will be omitted.

In the fabrication of the device of FIG. 3, it should be noted that the semi-insulating substrate 10 of GaAs is disposed in a reaction chamber of a reduced pressure MOVPE apparatus held at a pressure of 0.1 atm, and the deposition of the sub-collector layer 11 of n-type GaAs is conducted thereon at a substrate temperature of 650° C. while supplying TMGa (trimethylgallium) and $AsH_3$ (arsine) with respective flowrates of 26 sccm and 70 sccm, until the thickness of the layer 11 reaches 500 nm. During the growth of the layer 11, $Si_2H_6$ (disilane) is supplied with a flowrate of 150 sccm as a source of Si that acts in the layer 11 as an n-type dopant. As a result, the layer 11 is doped to the impurity concentration level of $4\times10^{18}$ cm$^{-3}$.

After the sub-collector layer 11 is formed as such, the supply of $Si_2H_6$ is interrupted, and the collector layer 12 is grown on the sub-collector layer 11 with a thickness of 500 nm in the form of an undoped GaAs layer. Further, the base layer 13 is grown on the collector layer 12 with a thickness of 100 nm by continuing the supply of TMGa and $AsH_3$ except that the dopant gas is switched from $Si_2H_6$ to $CBr_4$, wherein the $CBr_4$ acts as a source of C that dopes the GaAs layer 13 to the p-type. It should be noted that $CBr_4$ is supplied with a flowrate of 80 sccm, and the layer 13 is doped to the impurity concentration level of $4\times10^{19}$ cm$^{-3}$.

On the base layer 13, a deposition of the emitter layer 14 of n-type InGaP is conducted while maintaining the pressure inside the reaction chamber at 0.1 atm, until the thickness of the emitter layer 14 reaches 50 nm. More specifically, TMIn (trimethylindium) is supplied to the reaction chamber as a source of In together with TEGa (triethylgallium) acting as a source of Ga and $PH_3$ (phosphine) acting as a source of P, with respective flowrates of 200 sccm, 80 sccm and 200 sccm. Further, $Si_2H_6$ is supplied with a flowrate of 2 sccm as a source of Si. Thereby, the emitter layer 14 is doped to n-type with the impurity concentration level of $4\times10^{17}$ cm$^{-3}$.

Further, the deposition of the cap layer 16 is conducted on the emitter layer 14 by interrupting the supply of TMIn, TEGa and $PH_3$ and resuming the supply of TMGa and $AsH_3$ with respective flowrates of 26 sccm and 70 sccm. Thereby, the flowrate of $Si_2H_6$ is set to 16.7 sccm, and the cap layer 16 is formed with a thickness of 300 nm and with an impurity concentration level of $4\times10^{17}$ cm$^{-3}$, wherein the impurity concentration level is increased to $4\times10^{18}$ cm$^{-3}$ at the most outer surface of the cap layer 16.

In the process of formation of the layered structure of FIG. 3, one may use TEGa as the source of Ga. Further, in the formation of the base layer 13, one may use various combinations of source materials such as (TMGa, TMAs, $CBr_4$), (TEGa, $ASH_3$, $CBr_4$), (TEGa, TMAs, $CBr_4$), (TMGa, TMAs), and the like, in addition to the foregoing combination of (TMGa, $AsH_3$, $CBr_4$).

Further, the layered structure thus obtained is subjected to an etching process for exposing the surfaces of the sub-collector layer 11 and the base layer 13, and the emitter electrode 17, the base electrode 18 and the collector electrode 19 are provided on the respective exposed surfaces of the emitter layer 16, the base layer 13 and the sub-collector layer 11.

Figure 4:
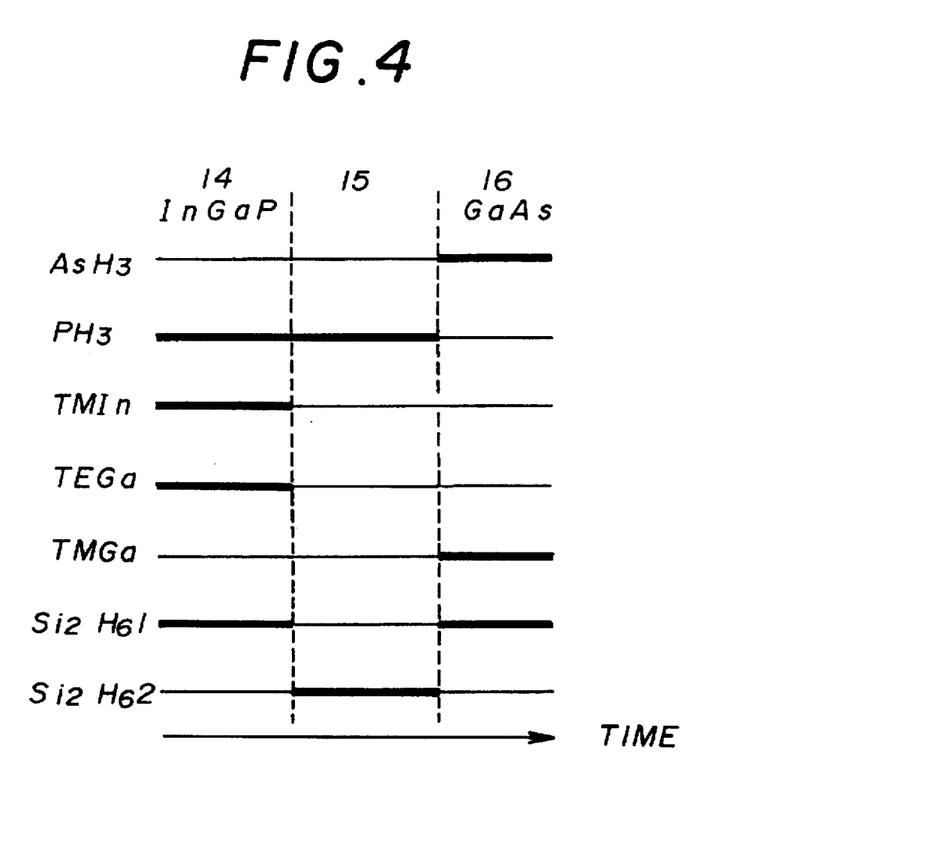
FIG. 4 is a diagram showing the sequence of gas supply employed in the process of fabricating the device of FIG. 3.

In the present embodiment, a step of planar doping process is interposed between the step of depositing the emitter layer 14 of InGaP and the step of depositing the cap layer 16 of GaAs, wherein a planar doping of Si is achieved in such a planar doping process by suppressing the supply of gaseous source of group III and V elements as indicated in FIG. 4.

Referring to FIG. 4 showing the supply sequence of the metal-organic gases for growing the layers 14 and 16, it will be noted that the layer 14 of n-type InGaP is grown on the base layer 13 of p-type GaAs by supplying simultaneously $PH_3$ as a source of P, TMIn as a source of In, TEGa as a source of Ga, and $Si_2H_6$ as an n-type dopant, as already explained.

After the layer 14 has grown to the predetermined thickness of 50 nm, the supply of TMIn and TEGa is interrupted for an interval of about 1 minute, while keeping the supply of $PH_3$ with a flowrate of 200 sccm under the condition in which the pressure inside the reaction chamber is set to 0.1 atm. Further, the supply of $Si_2H_6$ is conducted with a flowrate of 5 sccm during such an interval. Thereby, the surface of the layer 14 is doped to the n-type with an impurity-concentration level of about $1\times10^{12}$ cm$^{-2}$, without causing substantial growth in the layer 14, as indicated by a layer 15 in FIG. 3.

After the foregoing planar doping process of the layer 15, the supply of $AsH_3$ and TMGa is resumed as already noted, and the cap layer 16 of n-type GaAs is grown on such a planar-doped surface of the emitter layer 14 as can be seen also in FIG. 4.

Figure 5:
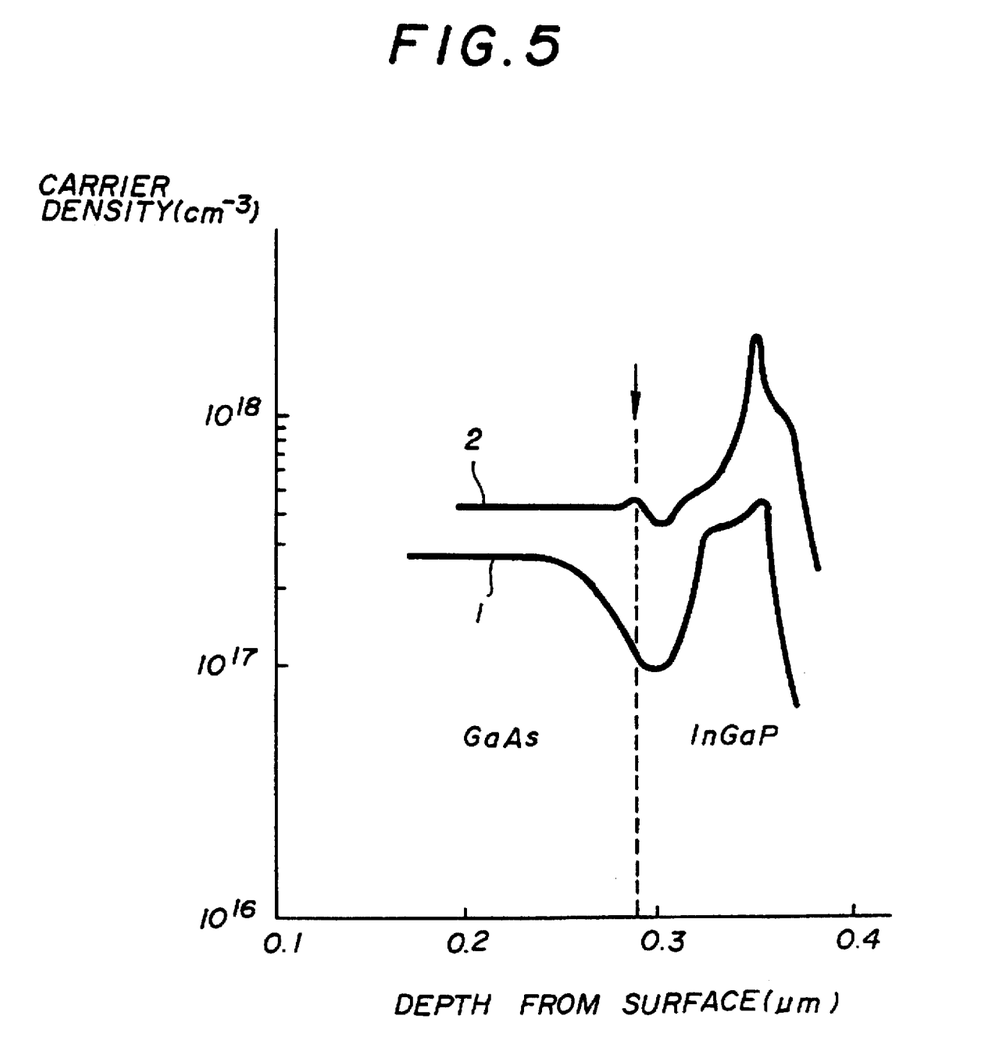
FIG. 5 is a diagram showing the effect of compensation of the carrier depletion achieved in the structure of FIG. 3.

FIG. 5 shows the result of measurement of the carrier density profile of a heteroepitaxial structure in which an n-type GaAs layer is formed on an n-type InGaP layer with a planar doping of Si conducted at the heteroepitaxial interface, wherein the profile is taken in the depth direction of the heteroepitaxial structure thus formed. Further, FIG. 5 shows a similar profile for a conventional heteroepitaxial structure in which an n-type GaAs layer is formed on an n-type InGaP layer but without such a planar doping. In FIG. 5, the vertical axis represents the carrier density while the horizontal axis represents the depth as measured from the surface of the GaAs layer, and the curve designated by "2" represents the carrier density for the structure formed with the planar doping of Si. The curve designated by "1," on the other hand, indicates the carrier density profile for the structure free from such a planar doping.

As will be apparent from FIG. 5, the conventional HBT shows a significant depletion of carriers at the heterojunction interface between the GaAs layer and the InGaP layer as clearly indicated by the dip of the curve "1" at the depth of about 0.3 μm, while the device of the present invention successfully compensates for the depletion of the carriers at such a heterojunction interface by implementing the planar doping as indicated by a curve "2." In FIG. 5, the location of the planar doped layer corresponding to the layer 15 of FIG. 3 or FIG. 4 is indicated by an arrow. It should be noted that the dose of such a planar doping is determined based upon the area of the depression appearing in the curve "1."

As a result of such a planar doping as indicated in FIG. 4 by the layer 15, the problem of formation of the high resistance layer 20 in the device of FIG. 1 is successfully eliminated. For example, the emitter resistance of the HBT of FIG. 3 is now reduced to 9–11Ω in the open collector measurement, wherein this value is about ¼–⅕ of the corresponding emitter resistance of the device of FIG. 1. In terms of resistivity in the stacking direction, the conventional device of FIG. 1 shows a resistivity of about $4 \times 10^{-6}$ $\Omega cm^2$ as a result of reduced carrier density of $4 \times 10^{17}$ $cm^{-3}$, while the device of FIG. 3 shows a resistivity of $9 \times 10^{-7}$ $\Omega cm^2$ in the stacking direction, which is about ⅕ the resistivity of the device of FIG. 1. Associated with the reduced emitter resistance, the HBT of the present embodiment shows the characteristic frequencies $f_T$ and $f_{max}$ of 50 GHz and 90 GHz respectively, which are significantly improved over the conventional characteristics.

In the HBT of the present embodiment, one can of course use other compositions for the emitter layer 14. For example, it is possible to use a mixed crystal of InGaP containing Al for the emitter layer 14. In such a case, the composition of the emitter layer 14 is represented as $Al_xIn_yGa_{1-x-y}P$, wherein the crystal of such a composition, including the composition in which the compositional parameter x=0, is characterized by a large bandgap. Further, it is possible to use a mixed crystal having a composition of AlGaAs for the cap layer 16. In such a case, the lattice matching is easily achieved between the cap layer 16 of AlGaAs and the emitter layer 14 of AlInGaP. Alternatively, the cap layer 16 may include therein a stacking of an AlGaAs layer and a GaAs layer.

In the process of FIG. 4, it should be noted that the supply of $PH_3$ is continued in the planar doping process. By continuously supplying P as such in the step of the planar doping where no substantial growth of the emitter layer 14 occurs, one can successfully suppress the evaporation of P from the InGaP layer 14 that is already deposited. Thereby, the formation of vacant site of P in the crystal structure of InGaP is successfully suppressed, and the undesirable mixing of As and P at the heterojunction interface at the time of deposition of the cap layer 16 is minimized.

It should be noted that Si used for the n-type dopant in the HBT of FIG. 3 has a small diffusion coefficient, which is particularly advantageous for compensating for the depletion of the carriers selectively at the cap-emitter heterojunction interface, as the diffusion of the dopant element away from the heterojunction is minimized by using Si for the dopant. Further, one may use group VI elements such as S or Se for the dopant.

Figure 6:
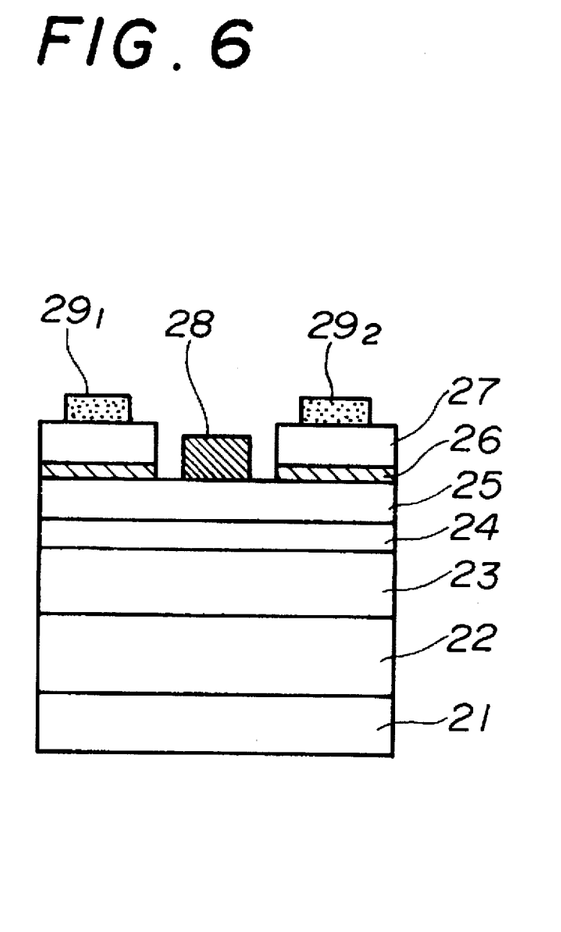
FIG. 6 is a diagram showing the construction of a HEMT according to a second embodiment of the present invention.

Next, a second embodiment of the present invention will be described with reference to FIG. 6 showing a HEMT similar to the HEMT of FIG. 2. In FIG. 2 those parts described previously are designated by the same reference numerals and the description thereof will be omitted.

Referring to FIG. 2, the substrate 21 of semi-insulating GaAs is disposed in a reaction chamber of a MOVPE apparatus held at a pressure of 0.1 atm similarly to the first embodiment, and the deposition of the buffer layer 22 of undoped GaAs is conducted thereon by supplying TMGa and $AsH_3$ as the source of Ga and As with respective flowrates of 26 sccm and 70 sccm, until the layer 22 grows to a thickness of about 1 μm. After the buffer layer 22 is formed as such, the deposition of the channel layer 23 is started further on the buffer layer 22 by continuously supplying TMGa and $AsH_3$ as the source of Ga and As, until the thickness of the channel layer 23 reaches about 500 nm.

After the channel layer 23 is formed as such, the spacer layer 24 of InGaP is grown on the channel layer 23 with a thickness of about 2 nm by supplying TMIn, TEGa and $PH_3$ to the reaction chamber with respective flowrates of 200 sccm, 80 sccm and 200 sccm, while maintaining the internal pressure of the reaction chamber at 0.1 atm. Similarly to the first embodiment, TMIn acts as a source of In, TEGa acts as a source of Ga, and $PH_3$ acts as a source of P. Further, the electron supplying layer 25 is grown on the spacer layer 24 with a thickness of about 50 nm by continuing the supply of TMIn, TEGa and $PH_3$.

During the growth of the electron supplying layer 25, it should be noted that $Si_2H_6$ is admixed to the foregoing source gases of TMIn, TEGa and $PH_3$ with a flowrate of 4 sccm, such that the electron supplying layer 25 is doped by Si to an impurity concentration level of $2 \times 10^{18}$ $cm^{-3}$.

After the electron supplying layer 25 is formed as such, the supply of the group III elements is interrupted such that further growth of the layer 25 is substantially interrupted. On the other hand, the supply of $PH_3$ is continued with a flowrate of 100 sccm together with the supply of $Si_2H_6$ for about 1 minute, wherein the flowrate of $Si_2H_6$ is set to about 10 sccm. Thereby, the surface of the electron supplying layer 25 is planar-doped by Si similarly to the first embodiment.

After the planar doping process as set forth above, the growth of the cap layer 27 is conducted on the electron supplying layer 25 by supplying TMGa and $AsH_3$ to the reaction chamber respectively with the flowrate of 26 sccm and 70 sccm, together with $Si_2H_6$ of which flowrate is set to 30 sccm, until the thickness of the layer 27 reaches about 50 nm. Thereby, the cap layer 27 is doped by Si with the impurity concentration level of $2 \times 10^{18}$ $cm^{-3}$.

After the cap layer 27 is formed as such, a part of the cap layer 27 is removed by an etching process to expose the surface of the electron supplying layer 25, and the gate electrode 28 of Al is provided on the exposed surface of the electron supplying layer 25. Further, the ohmic electrodes $29_1$ and $29_2$ of AuGe/Au are provided on the remaining cap layer 27 of GaAs as the source and drain electrodes, and the fabrication of the HEMT of FIG. 6 is completed.

By conducting the planar doping process as set forth above, the depletion of carriers at the interface between the electron supplying layer 25 and the cap layer 27 is successfully eliminated, and one can reduce the source-drain resistance of the HEMT substantially. Thereby, the HEMT shows various superior characteristics such as improved transconductance.

In the present embodiment, it should be noted that one can use undoped InGaAs for the channel layer 23 in place of undoped GaAs. In such a case, it is preferable to reduce the thickness of the layer 23 to 14 nm, for example.

In the HEMT of the present embodiment, too, one may use a mixed crystal of InGaP having a composition represented as $Al_xIn_yGa_{1-x-y}P$ for the electron supplying layer 25 in place of InGaP. Even in such a case, it is possible to grow a GaAs layer on the electron supplying layer 25 as the cap layer 27, as the substitution of Ga and Al in the cap layer 27 does not cause any substantial change of the lattice constant.

In any of the foregoing embodiments, the planar doping process is by no means limited to the supply of $Si_2H_6$ with a flowrate of 5 sccm for 1 minute, but the supply of $Si_2H_6$ may be conducted with a flowrate of 1.0–10.0 sccm for an interval between 30–120 seconds, depending upon the necessary dose, which in turn is determined based upon the depletion of the carriers at the heterojunction interface. Further, the source of Si in the planar doping process is by no means limited to $Si_2H_6$ but other source such as $SiH_4$ (silane) may be employed.

In the doping sequence of FIG. 4, it will be noted that $Si_2H_6$ is used both for the doping of the layer 14 and the planar doping. However, one may use usual $SiH_4$ for the doping of the layers 14 and 16 or for the layers 25 and 27. In this case, $Si_2H_6$ is used specifically for the planar doping. Such a doping sequence that uses $Si_2H_6$ specifically for the planar doping is particularly advantageous for the desired heavy doping of the layer 15 or the layer 26. It should be noted that $Si_2H_6$ has a larger decomposition rate as compared with $SiH_4$ in the temperature range used for a MOVPE process.

Further, such a planar doping process for compensating for the depletion of the carriers at the heterojunction interface of InGaP and GaAs is not only effective in n-type layers but also in p-type layers. In such a case, C is used as a p-type dopant in place of Si, wherein C may be supplied in the form of $CBr_4$. It should be noted that a similar depletion of carriers occurs at the heterojunction interface of GaAs and InGaP layers also when the layers of GaAs and InGaP are doped to the p-type.

Further, the planar doping process of the present invention is effective also for compensating for the depletion of carriers at the heterojunction interface of GaAs and a III-V layer containing Sb in place of P including a mixed crystal in which Sb and P are mixed in the site of the group V element.

Further, the semiconductor device to which the present invention is applicable is by no means limited to HBT or HEMT as explained with reference to the first and second embodiments, but the present invention is applicable also to other devices such as LED or laser diode where a heterojunction interface of GaAs and InGaP or AlInGaP is used.

In the MOVPE process of the InGaP layer such as the layer 14 or the layer 25, one may use tertiarybuthylphosphine in place of $PH_3$. As tertiarybuthylphosphine is a material of reduced hazard, the efficiency of production of the device is improved by doing so.

Further, the present invention is by no means limited to the embodiments described heretofore, but various variations and modifications may be made without departing from the scope of the invention.

What is claimed is:

1. A semiconductor device, comprising:
a first compound semiconductor layer containing a first group V element;
a second compound semiconductor layer containing a second, different group V element, said second compound semiconductor layer being provided on said first compound semiconductor layer;
a heterojunction interface formed at an interface between said first and second compound semiconductor layers;
said heterojunction interface containing a dopant with a sheet density such that a depletion of carriers at said heterojunction interface is substantially compensated.

2. A semiconductor device as claimed in claim 1, wherein said dopant comprises Si, and wherein both said first and second compound semiconductor layers are doped to the n-type.

3. A semiconductor device as claimed in claim 1, wherein said dopant comprises C, and wherein both said first and second compound semiconductor layers are doped to the p-type.

4. A semiconductor device as claimed in claim 1, wherein said first compound semiconductor layer contains P as said first group V element and wherein said second compound semiconductor layer contains As as said second group V element.

5. A semiconductor device as claimed in claim 1, wherein said first compound semiconductor layer contains As as said first group V element and wherein said second compound semiconductor layer contains Sb as said second group V element.

6. A semiconductor device as claimed in claim 4, wherein said first compound semiconductor layer comprises InGaP doped to the n-type by Si and said second compound semiconductor layer comprises GaAs doped to the n-type by Si.

7. A high electron mobility transistor, comprising:
a substrate;
a channel layer provided on said substrate;
a carrier supplying layer doped to a first conductivity type and provided on said channel layer, said carrier supplying layer comprising a first compound semiconductor material containing a first group V element;
a cap layer provided on said carrier supplying layer in an intimate contact with an upper major surface of said carrier supplying layer, said cap layer comprising a second compound semiconductor material doped to said first conductivity type and containing a second, different group V element;
a heterojunction interface formed between said carrier supplying layer and said cap layer, said heterojunction interface containing a dopant of said first conductivity type with a sheet density such that a depletion of carriers at said heterojunction interface is substantially compensated;
a gate electrode provided on said electron supplying layer for establishing a Schottky contact therewith;
a first ohmic electrode provided on said cap layer at a first side of said gate electrode for establishing an ohmic contact therewith; and
a second ohmic electrode provided on said cap layer at a second, opposite side of said gate electrode for establishing an ohmic contact therewith.

8. A high electron mobility transistor as claimed in claim 7, wherein said carrier supplying layer contains P as said first group V element and wherein said cap layer contains As as said second group V element.

9. A heterobipolar transistor, comprising:
a substrate;
a collector layer of a first compound semiconductor material provided on said substrate;
a base layer of a second compound semiconductor material provided on said collector layer, said base layer being doped to a first conductivity type;
an emitter layer of a third compound semiconductor material provided on said base layer, said emitter layer being doped to a second, opposite conductivity type, said third compound semiconductor material containing a first group V element;
a cap layer of a fourth compound semiconductor material provided on an upper major surface of said emitter layer in an intimate contact therewith, said cap layer being doped to said second conductivity type, said fourth compound semiconductor material containing a second, different group V element;
a heterojunction interface formed between said emitter layer and said cap layer, said heterojunction interface containing a dopant of said second conductivity type with a sheet density such that a depletion of carriers at said heterojunction interface is substantially compensated;

a collector electrode connected electrically to said collector layer;

a base electrode provided on said base layer in electrical connection therewith; and an emitter electrode provided on said cap layer in electrical connection to said emitter layer.

10. A heterobipolar transistor as claimed in claim 9, wherein said emitter layer contains P as said first group V element and wherein said cap layer contains As as said second group V element.

* * * * *